(12) United States Patent
Bisig et al.

(10) Patent No.: US 10,389,304 B2
(45) Date of Patent: Aug. 20, 2019

(54) SYSTEM HAVING AT LEAST ONE FREQUENCY CONVERTER

(71) Applicant: Schmidhauser AG, Romanshorn (CH)

(72) Inventors: Thomas Bisig, Romanshorn (CH); Thomas Lange, Hessisch Oldendorf (DE); Siegfried Haas, Constance (DE)

(73) Assignee: Schmidhauser AG, Romanshorn (CH)

( * ) Notice: Subject to any disclaimer, the term of this patent is extended or adjusted under 35 U.S.C. 154(b) by 0 days.

(21) Appl. No.: 15/934,655

(22) Filed: Mar. 23, 2018

(65) Prior Publication Data

US 2018/0278212 A1 Sep. 27, 2018

(30) Foreign Application Priority Data

Mar. 23, 2017 (DE) .................. 10 2017 204 915

(51) Int. Cl.
*H03D 7/16* (2006.01)
*H04W 88/08* (2009.01)
*H04W 84/12* (2009.01)
*H04B 1/38* (2015.01)

(52) U.S. Cl.
CPC ............... *H03D 7/16* (2013.01); *H04B 1/38* (2013.01); *H04W 84/12* (2013.01); *H04W 88/08* (2013.01)

(58) Field of Classification Search
USPC ........................................................ 455/323
See application file for complete search history.

(56) References Cited

U.S. PATENT DOCUMENTS

2005/0195537 A1* 9/2005 Virolainen ......... G05B 19/0426
361/18
2006/0009879 A1* 1/2006 Lynch .................. G05B 19/409
700/245
2010/0026518 A1* 2/2010 Kirst ..................... G01D 11/245
340/870.05
2011/0208440 A1* 8/2011 Pechstein ............... G01D 21/00
702/30
2013/0034184 A1* 2/2013 Roh ....................... H04L 12/413
375/295
2015/0019033 A1* 1/2015 Schroderus ........... H04L 67/125
700/286
2015/0048157 A1* 2/2015 Juslin ................. G05B 19/0426
235/375
2016/0277064 A1* 9/2016 Waxman ................ H04B 1/713

OTHER PUBLICATIONS

German-language Office Action issued in counterpart German Application No. 10 2017 204 915.4 dated Dec. 7, 2017 (six pages).
"Inverter i550 Cabinet 0.25 to 45 kW", Commissioning, Lenze Drives GmbH, Sep. 2016, pp. 1-512, https://inverterdrive.com/file/Lenze-i550-45kW-Manual.

* cited by examiner

*Primary Examiner* — Ganiyu A Hanidu
(74) *Attorney, Agent, or Firm* — Crowell & Moring LLP

(57) ABSTRACT

A system includes a number of frequency converters, wherein a respective frequency converter has a wired data interface and a frequency converter parameter memory. The system further includes a number of wireless local area network modules, wherein a respective WLAN module has a wired data interface. The data interface of the WLAN module can be coupled to the data interface of a frequency converter for the purpose of bidirectional data exchange, wherein the frequency converter parameter memory of a frequency converter is designed to store values of a number of frequency converter WLAN parameters.

10 Claims, 1 Drawing Sheet

SYSTEM HAVING AT LEAST ONE FREQUENCY CONVERTER

BACKGROUND AND SUMMARY OF THE INVENTION

The invention relates to a system having at least one frequency converter.

Frequency converters serve to actuate electric motors. It is often necessary to adjust such frequency converters during their operation, for example to set specific operating parameters to desired values.

The invention is based on the object of providing a system having at least one frequency converter that makes it possible to adjust the frequency converter or converters as conveniently as possible.

The invention achieves the object by providing a system having a number of frequency converters, wherein a respective frequency converter has a wired data interface and a frequency converter parameter memory. The system further has a number of wireless local area network modules, wherein a respective WLAN module has a wired data interface. The data interface of the WLAN module can be coupled to the data interface of a frequency converter for the purpose of bidirectional data exchange. The frequency converter parameter memory of a frequency converter is designed to store values of a number of frequency converter WLAN parameters.

The system has a number (for example 1 to 30) of frequency converters, that is to say power converters, which generate from an AC voltage an AC voltage whose frequency and/or amplitude can be changed for supplying power to electric machines such a three-phase motors.

A respective frequency converter from the number of frequency converters has a wired data interface. The wired data interface can have, for example, a socket or a plug. The wired data interface can be designed as a USB interface. The wired data interface can have, for example, a 10-pole plug connector.

A respective frequency converter from the number of frequency converters further has a frequency converter parameter memory. The frequency converter parameter memory can be a volatile or non-volatile frequency converter parameter memory. The frequency converter parameter memory can have a read-only memory and/or a random access memory.

The system further has a number (for example 1 to 30) of wireless local area network (WLAN) modules. A respective WLAN module from the number of WLAN modules has a wired data interface. The data interface of the WLAN module can be coupled to the data interface of a respective frequency converter for the purpose of bidirectional data exchange, that is to say the interfaces of the frequency converters are compatible with the interfaces of the WLAN modules.

If a WLAN module from the number of WLAN modules is coupled by way of its data interface to the data interface of a frequency converter from the number of frequency converters, data can be exchanged between the coupled WLAN module and the coupled frequency converter via the respective data interfaces.

The frequency converter parameter memory of a respective frequency converter is designed to store values of a number of frequency converter WLAN parameters. The values of the number of frequency converter WLAN parameters can be specified in advance and can be stored in the frequency converter parameter memory, as a result of which preconfiguration is possible.

In one refinement of the invention, a respective WLAN module has a module parameter memory. The module parameter memory is designed to store values of a number of module WLAN parameters. The module parameter memory can have a read-only memory and/or a random access memory. The values of the number of module WLAN parameters can be specified in advance and can be stored in the module parameter memory, as a result of which preconfiguration is possible.

In one refinement of the invention, a WLAN module, which is coupled to a frequency converter for the purpose of data exchange, is designed to control its operation depending on the stored values of the number of frequency converter WLAN parameters, and/or to control its operation depending on the stored values of the number of module WLAN parameters. The WLAN module can be capable of hot-plugging. A WLAN module coupled to a frequency converter can send and/or receive data via the WLAN.

In one refinement of the invention, a respective frequency converter and/or a respective WLAN module has a configuration control device, by means of which it is possible to specify whether the WLAN module controls its operation depending on the stored values of the number of frequency converter WLAN parameters or controls its operation depending on the stored values of the number of module WLAN parameters. The configuration control device can have or be, for example, a configuration memory, for example a read-only memory and/or a random access memory. A value stored in the configuration memory can control whether the WLAN module controls its operation depending on the stored values of the number of frequency converter WLAN parameters or controls its operation depending on the stored values of the number of module WLAN parameters. The configuration control device can also have or be a sensor and/or a configuration switch. A switching position of the configuration switch can control whether the WLAN module controls its operation depending on the stored values of the number of frequency converter WLAN parameters or controls its operation depending on the stored values of the number of module WLAN parameters. A state of the sensor can control whether the WLAN module controls its operation depending on the stored values of the number of frequency converter WLAN parameters or controls its operation depending on the stored values of the number of module WLAN parameters.

In one refinement of the invention, the number of frequency converter WLAN parameters are parameters for an infrastructure mode and/or the number of module WLAN parameters are parameters for an ad-hoc mode. In the infrastructure mode, the WLAN module can take on the function of a wireless access point, in particular the function of a router, or the function of a client. In the ad-hoc mode, the WLAN module can establish an ad-hoc network, wherein all the participants in the ad-hoc network are equivalent. With respect to the basic properties of the infrastructure mode and of the ad-hoc mode, reference is made to the relevant technical literature.

In one refinement of the invention, the number of frequency converter WLAN parameters and/or the number of module WLAN parameters has a WLAN SSID parameter. The WLAN SSID parameter denotes a service set identifier (SSID) of the WLAN. The value of the WLAN SSID parameter can be the service set identifier (SSID) of the WLAN.

In one refinement of the invention, the values of the frequency converter WLAN parameters of a frequency converter from the number of frequency converters are selected in such a way that said frequency converter forms a wireless access point. A frequency converter from the number of frequency converters can interact with a coupled WLAN module in such a way that the frequency converter, in connection with the coupled WLAN module, forms the wireless access point of the WLAN. The values of the frequency converter WLAN parameters of the remaining frequency converters of the number of frequency converters are selected in such a way that the remaining frequency converters form WLAN clients. The remaining WLAN client frequency converters can be connected to one another by way of the wireless access point frequency converter in such a way that they can exchange data with one another and with the wireless access point frequency converter.

In one refinement of the invention, a WLAN module can be mechanically coupled to a frequency converter by means of a latching connection. The latching connection can have a detent and a recess corresponding to the detent. In the case of the mechanical coupling of a WLAN module to a frequency converter, the detent can latch into the recess. The WLAN module can have the detent and the frequency converter can have the recess or the WLAN module can have the recess and the frequency converter can have the detent.

In one refinement of the invention, the system has an operating device having a WLAN interface. The operating device can be a smartphone, a tablet computer or a computer, for example. Data can be transmitted between the operating device and the frequency converters by means of the WLAN interface of the operating device and by means of the WLAN modules. The data can be diagnosis data, process data and/or state data, wherein state data describe a state of the frequency converter coupled to the WLAN module, in particular a fault state of the frequency converter coupled to the WLAN module. The operating device can be designed to control the frequency converter and/or to change settings of the frequency converter coupled to the WLAN module.

In one refinement of the invention, a frequency converter is designed to supply electrical energy to a WLAN module coupled to the frequency converter. The WLAN module can be supplied with electrical energy via the converter interface.

BRIEF DESCRIPTION OF THE DRAWINGS

The invention is described in detail below with reference to the drawings. In said drawings.

DETAILED DESCRIPTION OF THE DRAWINGS

Figure 1:
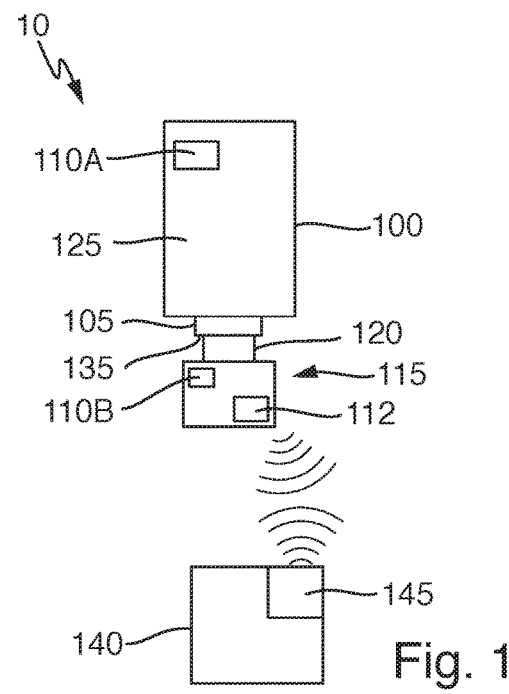
FIG. 1 shows a schematic block diagram of a system and
FIG. 2 shows a schematic block diagram of a variant of the system from FIG. 1.

FIG. 1 shows a system 10, which has a frequency converter 100. The frequency converter 100 has a frequency converter parameter memory 110A and a wired data interface 105 having a 10-pole socket.

The frequency converter parameter memory 110A of the frequency converter 100 is designed to store values of a number of frequency converter WLAN parameters. One of the values of the number of frequency converter WLAN parameters is a WLAN SSID parameter, wherein the WLAN SSID parameter denotes a service set identifier (SSID) of the WLAN.

The system 10 further has a wireless local area network (WLAN) module 115. The WLAN module 115 has a wired data interface 120 having a 10-pole plug. The wired data interface 120 of the WLAN module 115 is plugged into the wired data interface 105 of the frequency converter 100 such that data can be exchanged between the frequency converter 100 and the WLAN module 115 by way of the data interfaces 105, 120. The frequency converter 100 is designed to supply electrical energy to the coupled WLAN module 115.

The module 115 further has a module parameter memory 110B, which is designed to store values of a number of module WLAN parameters. One of the values of the number of module WLAN parameters is a further WLAN SSID parameter, wherein the further WLAN SSID parameter denotes a service set identifier (SSID) of the WLAN. The SSID stored in the frequency converter 100 can correspond to the SSID stored in the WLAN module 115 or can be different therefrom.

The module 115 further has a configuration control device in the form of a configuration memory 112, wherein a value stored in the configuration memory 112 controls whether the WLAN module 115 controls its operation depending on the stored values of the number of frequency converter WLAN parameters or controls its operation depending on the stored values of the number of module WLAN parameters.

In the case of a first value stored in the configuration memory 112, for example zero, the WLAN module 115 is operated in an infrastructure mode and the operation of the WLAN module 115 is controlled depending on the values of the number of frequency converter WLAN parameters. In the case of a second value stored in the configuration memory 112, for example one, the WLAN module 115 is operated in an ad-hoc mode and the operation of the WLAN module 115 is controlled depending on the values of the number of module WLAN parameters.

In the infrastructure mode, the value of the WLAN SSID parameter is transmitted from the frequency converter 100 to the WLAN module 115 after the coupling of the WLAN module 115 to the frequency converter 100. After the transmission of the value of the WLAN SSID parameter, the WLAN module 115 establishes a WLAN based on the transmitted SSID.

In the ad-hoc mode, the WLAN module 115 establishes a WLAN based on the SSID stored in the module parameter memory 110B after the coupling of the WLAN module 115 to the frequency converter 100.

In the example shown, the value of the operating mode (ad-hoc mode or infrastructure mode) is selected in such a way that the WLAN module 115 runs in the infrastructure mode and establishes a WLAN radio network in which the WLAN module 115 takes on the function of a router. In other words, the values of that frequency converter WLAN parameters of the frequency converter 100 stored in the frequency converter parameter memory 110A are selected in such a way that the WLAN module 115 runs in the infrastructure mode and thus forms, together with the frequency converter 100, a wireless access point 125 of the WLAN established by the WLAN module 115.

In order that the connection between the data interface 120 of the WLAN module 115 and the data interface 105 of the frequency converter 100 is not released unintentionally, the WLAN module 115 has a detent, which latches into a corresponding recess at the frequency converter 100. The latching of the detent into the recess produces a mechanical coupling by means of a latching connection 135 between the WLAN module 115 and the frequency converter 100.

The system 10 further has an operating device 140. The operating device 140 has a WLAN interface 145. Data are exchanged between the operating device 140 and the frequency converter 100 by means of the WLAN interface 145 of the operating device 140 and by means of the WLAN module 115 coupled to the frequency converter 100. After the connection has been successfully established, the frequency converter 100 transmits, for example, diagnosis data via the WLAN to the operating device 140.

Figure 2:
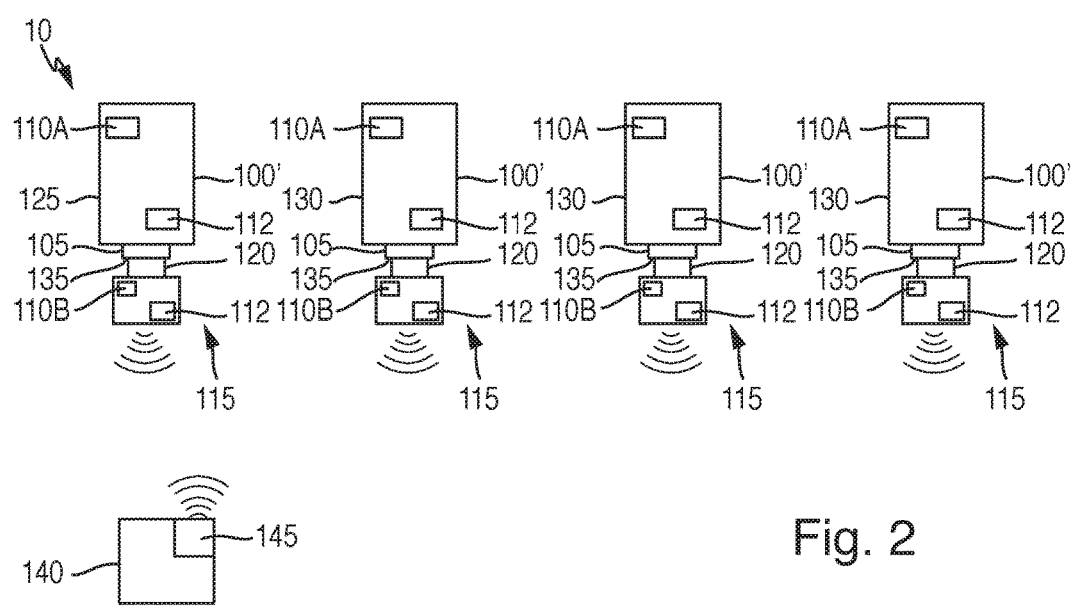

FIG. 2 shows a schematic view of a variant of the system 10 from FIG. 1. The same reference signs are selected for identical or identically acting elements; reference is therefore made in this respect to the above description.

The system 10 shown in FIG. 2 has four frequency converters 100' and four corresponding WLAN modules 115, wherein each of the WLAN modules 115 is connected to an associated frequency converter 100' by way of the data interfaces 120 of said WLAN modules.

The frequency converters 100' shown have a configuration control device in the form of a configuration memory 112. In the case of a first value stored in the configuration memory 112 of the frequency converter 100', for example zero, the WLAN module 115 is operated in an infrastructure mode and the operation of the WLAN module 115 is controlled depending on the values of the number of frequency converter WLAN parameters. In the case of a second value stored in the configuration memory 112 of the frequency converter 100', for example one, the WLAN module 115 is operated in an ad-hoc mode and the operation of the WLAN module 115 is controlled depending on the values of the number of module WLAN parameters. The value stored in the configuration memory 112 of the frequency converter 100' takes precedence over the value stored in the configuration memory 112 of the WLAN module 115.

The values stored in the configuration memories 112 of the respective frequency converters 100' are selected in such a way that the respective WLAN modules 115 are operated in an infrastructure mode.

The frequency converter WLAN parameters of the frequency converter 100' illustrated on the far left are selected in such a way that said frequency converter forms, together with its WLAN module 115, a wireless access point 125. The frequency converter WLAN parameters of the remaining frequency converters 100' are selected in such a way that said remaining frequency converters form, together with their WLAN modules 115, clients 130, which are registered at the wireless access point 125 via WLAN.

The operating device 140 is likewise registered as a client at the wireless access point 125 by way of WLAN. In this way, diagnosis data from all four frequency converters 100' can be transmitted to the operating device 140, wherein the entire WLAN is automatically configured by means of the values of the frequency converter WLAN parameters stored in the frequency converters 100'.

What is claimed is:

1. A system, comprising:
a number of frequency converters, wherein a respective frequency converter comprises:
   a wired data interface, and
   a frequency converter parameter memory;
a number of wireless local area network modules, wherein a respective WLAN module comprises:
   a wired data interface, wherein
   the data interface of the WLAN module is couplable to the data interface of a frequency converter for purpose of bidirectional data exchange,
   the frequency converter parameter memory of a frequency converter is designed to store values of a number of frequency converter WLAN parameters, and
   the frequency converter is designed to transmit the values of the number of frequency converter WLAN parameters stored in the frequency converter parameter memory over its wired data interface to the WLAN module.

2. The system as claimed in claim 1, wherein
a respective WLAN module has a module parameter memory, which is designed to store values of a number of module WLAN parameters.

3. The system as claimed in claim 2, wherein
a WLAN module, which is coupled to a frequency converter for data exchange, is designed to control its operation depending on the stored values of the number of frequency converter WLAN parameters, and/or to control its operation depending on the stored values of the number of module WLAN parameters.

4. The system as claimed in claim 3, wherein
a respective frequency converter and/or a respective WLAN module has a configuration control device, by which it is possible to specify whether the WLAN module controls its operation depending on the stored values of the number of frequency converter WLAN parameters or controls its operation depending on the stored values of the number of module WLAN parameters.

5. The system as claimed in claim 2, wherein
the number of frequency converter WLAN parameters are parameters for an infrastructure mode, and/or
the number of module WLAN parameters are parameters for an ad-hoc mode.

6. The system as claimed in claim 2, wherein
the number of frequency converter WLAN parameters and/or the number of module WLAN parameters have a WLAN SSID parameter, wherein the WLAN SSID parameter denotes a service set identifier of the WLAN.

7. The system as claimed in claim 1, wherein
the values of the frequency converter WLAN parameters of a frequency converter of the number of frequency converters are selected such that said frequency converter forms a wireless access point, and
the values of the frequency converter WLAN parameters of the remaining frequency converters of the number of frequency converters are selected such that said frequency converters form clients.

8. The system as claimed in claim 1, wherein
a WLAN module is mechanically couplable to a frequency converter via a latching connection.

9. The system as claimed in claim 1, further comprising:
an operating device having a WLAN interface, wherein data is transmittable between the operating device and a frequency converter via the WLAN interface of the operating device and via a WLAN module coupled to the frequency converter.

10. The system as claimed in claim 1, wherein
a frequency converter is designed to supply electrical energy to a WLAN module coupled to the frequency converter.

* * * * *